United States Patent
Adams et al.

(10) Patent No.: US 9,373,511 B2
(45) Date of Patent: Jun. 21, 2016

(54) METHODS FOR CRYSTALLIZING A SUBSTRATE USING ENERGY PULSES AND FREEZE PERIODS

(75) Inventors: Bruce E. Adams, Portland, OR (US); Aaron Muir Hunter, Santa Cruz, CA (US); Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 553 days.

(21) Appl. No.: 13/601,069

(22) Filed: Aug. 31, 2012

(65) Prior Publication Data
US 2013/0055731 A1 Mar. 7, 2013

Related U.S. Application Data

(60) Provisional application No. 61/530,265, filed on Sep. 1, 2011.

(51) Int. Cl.
*C30B 1/02* (2006.01)
*H01L 21/268* (2006.01)
*H01L 21/02* (2006.01)

(52) U.S. Cl.
CPC ........ *H01L 21/268* (2013.01); *H01L 21/02521* (2013.01); *H01L 21/02686* (2013.01)

(58) Field of Classification Search
CPC .............. C30B 1/00; C30B 1/02; C30B 1/023
USPC ............. 117/4, 7–8, 11, 37, 46, 73, 904, 928, 117/930; 219/121.6, 121.61, 121.65, 219/121.75, 121.76; 438/478, 482, 486, 438/487
See application file for complete search history.

(56) References Cited

U.S. PATENT DOCUMENTS

| 5,304,357 A | 4/1994 | Sato et al. | |
|---|---|---|---|
| 2004/0009632 A1* | 1/2004 | Tanabe | H01L 21/2026 438/166 |
| 2009/0032511 A1* | 2/2009 | Adams | B23K 26/0604 219/121.75 |
| 2011/0129959 A1 | 6/2011 | Moffatt | |

FOREIGN PATENT DOCUMENTS

| JP | 2003068644 A | 3/2003 |
|---|---|---|
| TW | 488079 B | 5/2002 |

OTHER PUBLICATIONS

Taiwan Office Action dated Feb. 17, 2016 for Application No. 101129570.

* cited by examiner

*Primary Examiner* — Kenneth A Bratland, Jr.
(74) *Attorney, Agent, or Firm* — Patterson & Sheridan, LLP

(57) ABSTRACT

Apparatus and methods of treating a substrate with an amorphous semiconductor layer, or a semiconductor layer having small crystals, to form large crystals in the substrate are described. A treatment area of the substrate is identified and melted using a progressive melting process of delivering pulsed energy to the treatment area. The treatment area is then recrystallized using a progressive crystallization process of delivering pulsed energy to the area. The pulsed energy delivered during the progressive crystallization process is selected to convert the small crystals into large crystals as the melted material freezes.

3 Claims, 2 Drawing Sheets

METHODS FOR CRYSTALLIZING A SUBSTRATE USING ENERGY PULSES AND FREEZE PERIODS

CROSS-REFERENCE TO RELATED APPLICATIONS

This application claims benefit of U.S. Provisional Patent Application Ser. No. 61/530,265 filed Sep. 1, 2011, which is incorporated herein by reference.

FIELD

Embodiments described herein relate to manufacture of semiconductor devices. More specifically, embodiments described herein relate to forming crystalline semiconductor layers for energy, memory, logic, or photonic devices.

BACKGROUND

Crystalline semiconductor materials are used increasingly for numerous applications in logic, memory, energy, and photonic devices. Generally speaking, large-grain crystalline materials, such as microcrystalline and monocrystalline materials, have lower optical, thermal, and electrical resistivity, than smaller-grain or amorphous materials. Amorphous materials typically melt at lower temperatures than corresponding crystalline materials, typically have lower electrical conductivity, and are typically less optically transmissive and absorptive.

Many methods are commonly used to make crystalline devices, including various forms of epitaxy, annealing, and deposition. A common theme among all these processes is time. Slower processes allow more time for atoms deposited or moved from their locations to find the lowest energy positions in a solid matrix.

As the size of electronic devices continues to decline, the desirable electrical properties of crystalline semiconductors are becoming more attractive. In particular, the future progression of Moore's Law is driving the development of vertically integrated monolithic 3D devices such as flash memory and DRAM that benefit from large-scale crystallization and recrystallization. Moreover, as the dimension of conductive components declines, resistivity of those components is becoming an issue for manufacturers, and crystal structure of the metals and alloys that make up those conductive components is becoming an active area of investigation. Accordingly, there is a need in the art for high-volume, cost-effective methods of crystallizing materials used in semiconductor processing.

SUMMARY

Embodiments described herein provide methods of treating a substrate with an amorphous semiconductor layer, or a semiconductor layer having small crystals, to form large crystals in the substrate. A treatment area of the substrate is identified and melted using a progressive melting process of delivering pulsed energy to the treatment area. The treatment area is then recrystallized using a progressive crystallization process of delivering pulsed energy to the area. The pulsed energy delivered during the progressive crystallization process is selected to convert the small crystals into large crystals as the melted material freezes.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
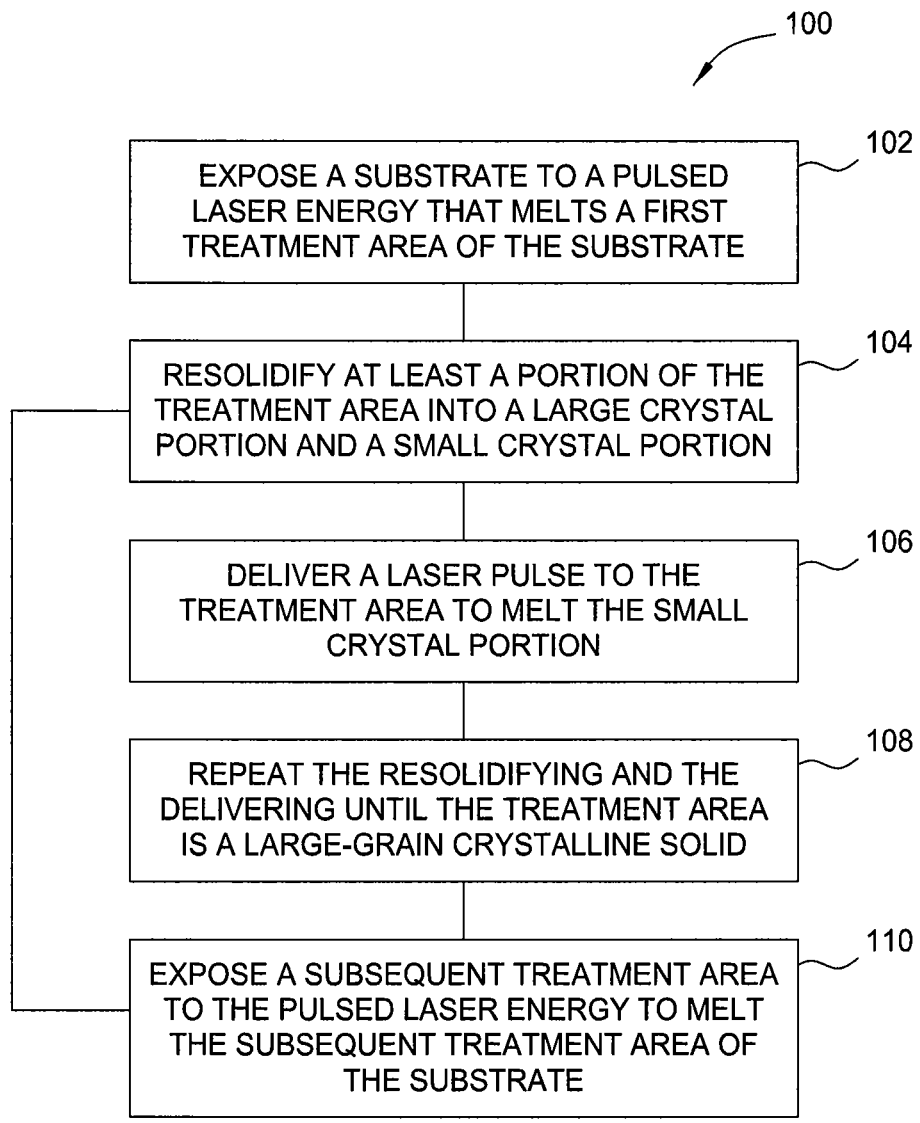
FIG. 1 is a flow diagram summarizing a method according to at least one embodiment.

FIG. 1 is a flow diagram summarizing a method 100 according to at least one embodiment. The methods of FIG. 1 may be used to increase the crystallinity or crystal grain size of a semiconductor material. Semiconductor materials for which the methods described herein may be used include elemental semiconductors such as silicon and germanium, combinations of elemental semiconductors, such as various formulations of silicon-germanium ($Si_xGe_y$), and compound semiconductors such as Group III/V semiconductors and Group II/VI semiconductors. Examples of compound semiconductors that may benefit from the methods described herein include, but are not limited to, CIGS materials, gallium arsenide, indium gallium arsenide, indium phosphide, indium antimonide, indium aluminum gallium arsenide, gallium phosphide, zinc telluride, gallium/aluminum/indium nitrides, silicon carbide, and other similar combinations.

A substrate of any of the materials mentioned above is disposed in an energy device operable to deliver pulsed laser energy, or other types of pulsed energy such as flash lamp or electron beam energy, to the substrate. At 102, the substrate is exposed to pulsed laser energy to melt a first treatment area of the substrate. A single pulse of laser energy may suffice in some cases, but two or more pulses may be delivered in other cases. In cases where a single pulse is used to melt the treatment area, the ambient temperature of the substrate may be increased to reduce thermal stresses from rapid heating of the treatment area. The elevated ambient is typically less than about 500° C., such less than about 400° C., for example between about 100° C. and about 400° C. In some embodiments, the ambient temperature may be room temperature or below.

Characteristics of the pulsed laser energy, such as fluence and duration are selected to melt the treatment area. Typically, energy content delivered to melt the treatment area is just below an amount of energy that would ablate the substrate surface. In one embodiment, two pulses of 532 nm laser light from a frequency-doubled Nd:YAG laser, each pulse having fluence of about 0.45 $J/cm^2$ and duration of about 26 nsec., separated by a duration of about 31 nsec., may be used to melt a portion of a silicon substrate. In some cases, a pulse train may be used to melt the treatment area.

At 104, at least a portion of the treatment area is resolidified to form a large crystal portion and a small crystal portion. The resolidification may be initiated by contact between the melt phase and a crystalline seed. As the temperature near the crystalline seed drops to near the freezing point of the liquid material, a freeze front begins to propagate through the treatment area as a surface that is articulated in three-dimensions.

The rate at which the freeze front propagates is typically about 10-30 m/sec, limited by rate of heat removal from the melt phase into the bulk of the substrate, which is therefore enhanced by maintaining the substrate at a lower ambient temperature.

The ambient temperature at which the substrate is most beneficially maintained depends on the material being processed. Many of the temperatures described herein are relevant to silicon, doped silicon, and alloys that are mostly silicon, but it should be understood that other temperatures will be relevant to other materials. Copper and germanium, for example, have similar melting points that are lower than silicon, and compound semiconductors containing gallium may have dramatically lower melting points than silicon. Silicon carbide, on the other hand, has a melting point higher than silicon. Moreover, the different materials have different thermal conductivities and thermal heat capacitites, or specific heat capacities, that influence cooling rates. Gallium arsenide, for example, is a relatively poor thermal conductor, so a lower ambient relative to its melting point may be beneficial for crystallizing gallium arsenide. Thus, room temperature substrate ambients, or ambients below room temperature, may be desired for some embodiments, while higher ambients may be useful for others.

The process of freezing typically proceeds faster than the process of crystal formation, a disparity that is intensified by large temperature difference between the melt phase and the solid phase. As the freeze front progresses, a large crystal area develops up to a first distance from the seed material, and a small crystal area develops to a second distance further from the seed material than the first distance. In most prior art processes, the temperature difference between the melt phase and the solid phase is managed by maintaining the substrate at an elevated ambient temperature to reduce the rate of heat removal from the melt phase. The inventors have discovered that by delivering pulses of energy having a duration and energy content selected to deliver an appropriate amount of energy to the freeze front and the small crystal area, the temperature difference between the small crystal area and the melt phase can be reduced by preferentially heating the small crystal area, and the rates of crystallization and freezing more nearly matched. By delivering an energy pulse with appropriate characteristics to the freeze front, it is possible to perform large crystal recrystallization at virtually any ambient substrate temperature quickly.

At 106, a laser pulse is delivered to the treatment area. The laser pulse, which may be a freeze control pulse, may melt the small crystal area, or the laser pulse may preferentially raise the temperature of the small crystal area to a temperature close to the temperature of the melt phase, for example within about 10° C. of the melt phase temperature. The laser pulse has an energy content and duration selected based on the mass of the small crystal area developed during the resolidification of 104. The duration is selected such that power delivery to the substrate is most efficient. Power delivery that is above an efficient zone results in reflection of substantial power from the substrate and/or damage to the substrate.

The energy content delivered by the laser pulse is selected to increase the temperature of the small crystal area to a temperature near the melt temperature. The temperature may be just above or just below the melt temperature, such that the small crystal area, or a portion thereof, melts or nearly melts. The energy content of the laser pulse may be selected to melt a desired fraction of the small crystal area while providing energy to convert the rest of the small crystal area to large crystals. Depending on the ambient substrate temperature, the small crystal area will have a temperature gradient from near the melt temperature adjacent to the liquid area to a lower temperature far from the liquid area. In some embodiments, a temperature of the small crystal area may be below about 200° C. at points far from the liquid area prior to delivery of the laser pulse. Determination of the energy content to deliver with each pulse will generally account for absorption characteristics of the substrate, and how those characteristics change with temperature and phase.

At 108, the melt area is again resolidified, and a second laser pulse, which may also be a freeze control pulse, is delivered to the small crystal area developed during the second resolidification. This progressive crystallization process may be repeated any number of times until the desired area is recrystallized into large grain crystals. The energy content of the second freeze control pulse may be different from the energy content of the first freeze control pulse, and subsequent freeze control pulses may have different energy content than either the first or second freeze control pulses, depending on the mass of small crystals to be treated each cycle.

At 110, a subsequent treatment area different from the first treatment area is identified and targeted, and the process of melting and controlled resolidification is repeated. Treatment area after treatment area may be identified and treated until an entire substrate is processed into a crystalline solid material. Each treatment area may overlap with a previous treatment area, if desired, to use the prior treatment area as a crystal seed source. In other embodiments, each treatment area may be spaced apart from previous treatment areas to manage thermal stresses.

In some embodiments, pulses of energy may be delivered to the substrate to maintain an interface energy of the freeze front above a nucleation point or an epitaxy point. In such a freeze process, which may be a crystallographic freeze process, a train of low energy pulses is delivered that limits the rate of cooling in a boundary layer near the interface to about 500 K/µsec or less. Cooling rates much above this level result in development of low energy locations along the freeze front interface that nucleate small crystal growth. Each pulse of energy added to the freeze front reduces the cooling rate and maintains the interface energy to maintain the growth of large crystals.

In one embodiment, a 1 cm$^2$ die will naturally freeze in about 700 µsec. Using the pulsed laser melt and recrystallization process described above, freezing such a 1 cm$^2$ die into large crystals may be accelerated to a duration of about 5 µsec or less at virtually any substrate ambient temperature. Thus, an amorphous semiconductor layer formed over the surface of a nominally 700 cm$^2$ circular substrate (e.g. a 300 mm wafer) may be converted to large crystals of dimension about 8 µm or more in 3.5 msec of processing time, with extra time potentially needed to position the substrate for processing each die. Because the substrate may be processed at ambient temperature, there is no need for heat-up and equilibration time before processing a substrate or any substantial cool-down time afterward.

The methods described herein may be applied to substrates of any size and shape. Circular wafers of diameter 200 mm, 300 mm, 450 mm, 12 in., may be treated as described herein. Non-circular substrates, such as rectangular panels of any arbitrary size, for example solar panels or display panels up to Gen 8.5 (i.e. 2200 mm×2600 mm) may also be processed according to the methods given herein. As noted above, monolithic 3D substrates may also be processed according to the methods described herein. In processing monolithic 3D substrates, multiple layers of the substrate may be crystallized in one treatment.

In one embodiment, a substrate having at least one crystalline silicon island formed thereon is subjected to a vapor or liquid deposition process to form an amorphous silicon layer thereon. The amorphous silicon layer is deposited to a uniform thickness of about 7 μm. The substrate with the amorphous layer thus formed is positioned on a work surface of a laser processing device. The substrate is maintained at an ambient temperature that is near room temperature, for example about 20° C. The substrate is aligned as necessary by rotating so that a die pattern on the substrate is aligned with the cross-sectional shape of the laser beam. Maintaining the substrate near room temperature after alignment reduces the possibility of alignment drift due to thermal expansion effects. Alternately, the substrate may be heated to reduce the overall energy signature of the process. In most embodiments, the substrate ambient will be maintained at less than about 200° C.

A first die of the amorphous layer is identified for treatment, and the substrate positioned such that the first treatment die is aligned with the laser source, for example by moving the work surface according to an x-y positioning control. The first treatment die is an area of the amorphous layer formed over a crystalline silicon seed. A first laser pulse having fluence of 0.45 J/cm$^2$ and duration of 26 nsec is delivered to the first treatment die. After a rest duration of 31 nsec, a second laser pulse having the same fluence and duration is delivered to the first treatment die. The two laser pulses substantially melt the amorphous silicon material without melting the crystalline seed.

The molten silicon is allowed to freeze for a first freeze duration of 700 nsec. A third laser pulse having the same fluence and duration is then delivered to the first treatment die. The third laser pulse thermally treats any small crystals that grow in the molten silicon, driving them to convert to large crystals. The molten silicon is then allowed to freeze for a second freeze duration of 1200 nsec. A fourth laser pulse having reduced fluence of 0.26 J/cm$^2$ and the same duration as the prior pulses, is delivered to the first treatment die. The fourth laser pulse completes conversion of the first treatment die to large crystal silicon.

The substrate is then moved to target an adjacent die for treatment, and the process is repeated. If the adjacent die does not contain a crystalline seed, contact with the prior treated die serves to seed crystallization. In this way, the entire amorphous layer may be converted to large crystal silicon.

The method 100 is described using freeze periods at 104 and 108 that result in formation of large grain crystals and small grain crystals, with laser pulses delivered to convert the small grain crystals into large grain crystals. In other embodiments, laser pulses may be delivered after freeze periods that end before small crystals are generated. As described above, the rate of freezing and crystallization are different depending on the ambient temperature of the substrate. Freeze control pulses may be delivered, for example, before the interface energy of the freeze front drops to a nucleation point to start development of small crystals. Delivering multiple freeze control pulses after such short freeze periods may enable recrystallization without generating small crystals. Such progressive crystallization methods may yield crystalline materials with grain sizes of 50 μm or more. The energy content delivered with each pulse of a train of such pulses will depend on the energy needed to maintain the freeze front at an energy above the nucleation point for the next freeze period without substantially slowing the freeze rate. Thus, each pulse of energy adds energy to the interface, raising the energy of the interface a desired amount above the nucleation point. It is anticipated that, to recrystallize a 7 μm thick amorphous layer, delivering laser pulses about every 100 nsec having fluence less than about 0.2 J/cm$^2$ over a pulse duration of about 26 nsec, will maintain growth of a large crystal freeze front at a rate approaching the natural freeze rate of about 10 m/sec.

In one aspect, the pulsed laser energy processes described above is thought to utilize energy released as atoms move from higher energy positions to lower energy positions to maintain the process. It is believed that a pulse of laser energy momentizes atoms in the small crystals or amorphous regions, starting motion of the atoms that continues until the atoms find energy wells large enough to overcome the kinetic energy imparted by the laser pulse. The energy released by each atom achieving its energy well becomes thermal energy within the solid material. This thermal energy is propagated to other atoms in the matrix that have not yet been momentized. In some cases, additional atoms become momentized by the thermal energy released, continuing the process of reorganizing the small crystals and amorphous areas of the solid. Energy may thus be delivered by laser pulses that would ordinarily not be enough to melt the small crystals or the amorphous areas under standard conditions, but because thermal energy from the reorganization process is present, the additional energy added externally helps drive the reorganization process.

Such a model of momentizing atoms in a reorganization is like melting because atoms in a state of low kinetic energy, "solid" atoms, are boosted into a state of higher kinetic energy, "liquid" atoms, so they "melt". When the atoms then find an energy well large enough to overcome their kinetic energy, they "freeze". Momentizing large numbers of atoms may produce or maintain a detectable liquid phase in the material, while momentizing small numbers of atoms may produce only a very local reorganization phase characterized by a small region wherein atoms are en route to lower energy positions. In the context of "melting" and "freezing", the thermal energy released by atoms finding low energy wells that overcome their kinetic energy may be thought of as a kind of latent heat.

On a large scale, it is thought that maintaining a reorganization phase in the material may drive a process of explosive crystallization or explosive growth in which large crystals grow quickly. An increment of energy may be added using energy pulses that, when added to the thermal energy released by the ongoing reorganization, is enough to momentize new atoms to move to lower energy positions. If such a process is maintained by maintaining energy at the regrowth front, or the freeze front, in a window that is above but near an epitaxy point, large crystals may be grown from amorphous material or small crystals at a relatively high rate, for example about 10 m/sec. in silicon.

The energy input rate using freeze control pulses may be controlled to deliver energy that will melt small crystals or amorphous material under standard conditions, meaning conditions wherein thermal energy of reorganization is not available. In other embodiments, the energy input may be controlled to deliver energy that will not melt small crystals or amorphous material under standard conditions, but will add enough energy to the thermal energy of reorganization to maintain a process of explosive growth.

In some embodiments, energy pulses may be delivered that maintain a melt phase and avoid formation of small crystals. In such embodiments, a similar thermal phenomenon is thought to occur in which the thermal energy released on freezing, the latent heat, is propagated into the melt phase and the solid phase. The thermal energy promotes maintaining the liquid state of the melt phase, along with energy added externally.

The rate of energy input that efficiently supports a regrowth process generally depends on the local energy balance at the crystallization front. Energy of material on both sides of the front is being removed primarily by conduction into the substrate bulk, the rate of which is controlled by thermal conductivity of the substrate material. In one example, the substrate bulk may be silicon over silicon oxide. The silicon conducts thermal energy relatively well, while the silicon oxide is relatively insulating. The silicon oxide reduces the rate at which thermal energy leaves the silicon, and thicker oxide suppresses energy loss more than thinner oxide. Thus, external energy input to maintain an efficient, or explosive, regrowth process is less for silicon on a relatively thicker oxide layer, for example above about 2.5 µm thick, than for a relatively thinner oxide layer, for example less than about 1.0 µm thick, because the thicker oxide layer slows the escape of energy from the silicon.

Ambient heating of the substrate also affects the rate of energy input that effectively promotes the regrowth process. With ambient energy being added to the substrate, energy loss at the regrowth front is slower, so a regrowth process may be maintained with a lower rate of laser energy input. The rate at which the melt phase freezes into small crystals is reduced by the presence of ambient heat, allowing the regrowth process more time to propagate.

Pulse fluence, pulse duration, and pulse timing all affect the rate of energy input to the treatment area. With thicker oxide, for example 2-3 µm, and little ambient heating, the conditions described above promote a regrowth process that may yield crystals 8 µm in dimension or larger. Timing of the freeze control pulses described above may be varied within a window of about 100 nsec without significant effect on the process. Increasing the rest duration between the pulses will have little physical impact on the process, other than increasing the overall duration of the process, because the various melt phases generated by the process freeze into small crystals that are re-energized by each pulse to promote an increment of regrowth. Reducing the rest duration between the pulses more than about 50 nsec increases the rate of heat input beyond an overall equilibrium resulting in thermal energy buildup in the material and slower crystallization. Sufficient increase in pulse rate may stop or reverse crystallization.

With thinner oxide, for example between 500 nm and 1 µm, and little ambient heating, heat loss is faster, so energy input rate for a regrowth process will be faster as well. In such an embodiment, a freeze control pulse may be delivered every 300 nsec to drive a regrowth process without significant thermal energy buildup. Fluence may also be increased, up to near the point of surface ablation, for example up to about 0.6 J/cm$^2$.

Figure 2:
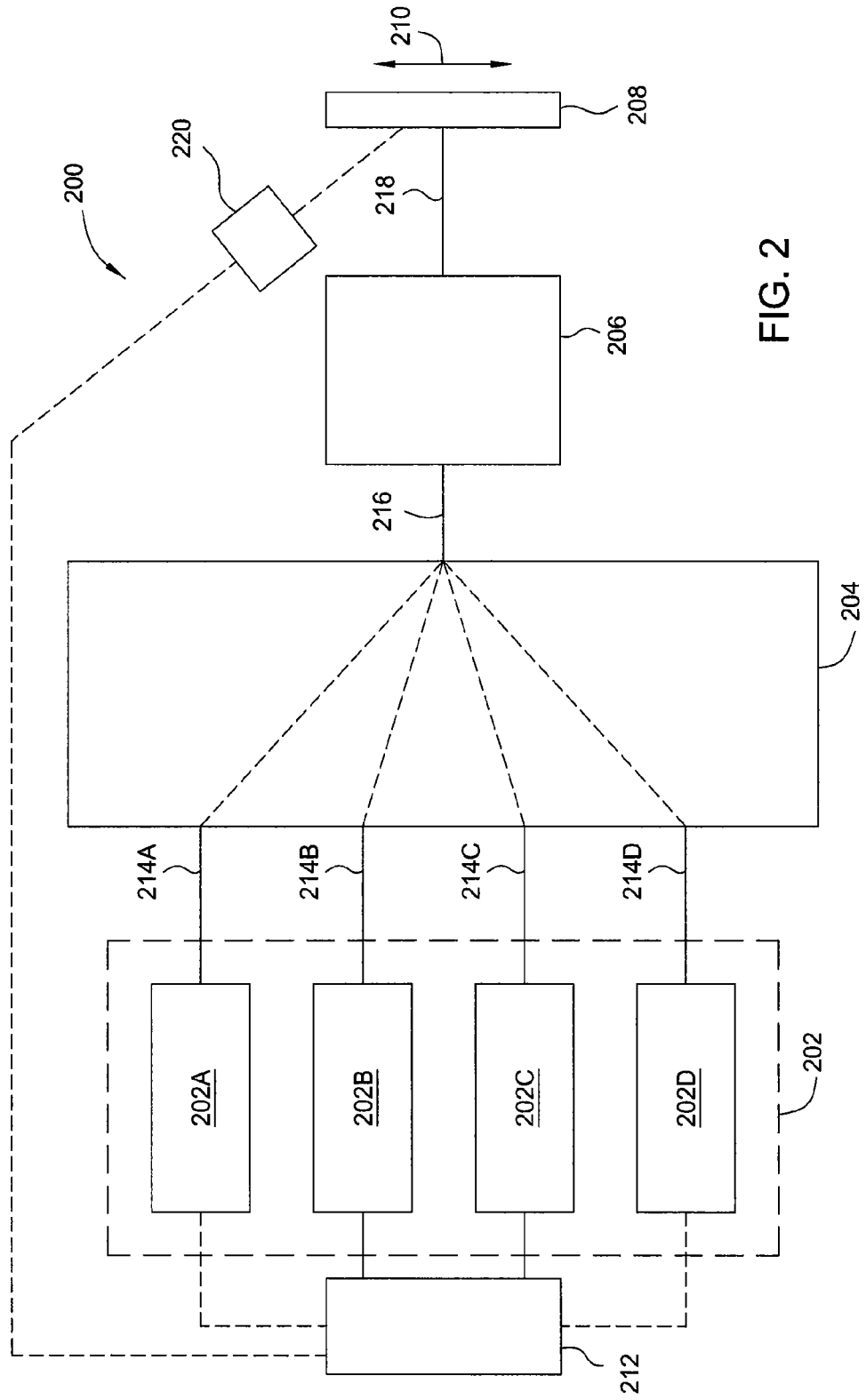
FIG. 2 is a schematic diagram of an apparatus according to at least one embodiment.

FIG. 2 is a schematic diagram of an apparatus 200 that may be used to practice the methods described herein. The apparatus 200 has an energy source 202, a collector 204, a shaper 206, and a work surface 208. The energy source 202 may have a plurality of energy generators, as exemplified by energy generators 202A-D shown in FIG. 2. Alternately, the energy source 202 may have a single energy generator, or more or less than the four energy generators 202A-D shown in FIG. 2. Multiple energy generators may be beneficial in allowing delivery of energy pulses having different power, duration, and timing in some embodiments. A single energy generator that is tunable as to energy content, duration, and timing may also suffice. In one embodiment, each of the energy generators 202A-D is a solid state laser, such as a Nd:YAG laser, having power between about 100 MW and about 500 MW.

The energy emitted by the energy source 202 is generally controllable with regard to duration, energy content, and timing. A controller 212 communicates with each of the energy generators 202A-D of the energy source 202. In the embodiment of FIG. 2, each of the energy generators 202A-D is a pumped q-switched laser, and the controller has an electronic timer that communicates electrically with the q-switch of each laser to control pulse delivery. Fluence may be controlled by coupling the controller 212 to the pumping device of each energy generator 202A-D. The controller 212 can be programmed to generated pulses of energy 214A-D from the four energy generators 202A-D, with each pulse having different fluence and duration, and each pulse being released at specific times in relation to each other.

The pulses 214A-D travel into the collector 204, which aligns the pulses 214A-D along a single output optical axis 216 for relaying to a substrate positioned on the work surface. The collector 204 has a plurality of input optical axes for receiving the energy pulses 214A-D from the energy source 202. The collector 204 generally has various optical devices, such as lenses, mirrors, prisms, and filters that bring the incident energy pulses 214A-D to the optical axis 216.

Energy aligned on the optical axis 216 enters the shaper 206. The shaper has optical devices such as lenses, mirrors, prisms, and filters that convert a native energy pulse from the energy generators 202A-D into a shaped pulse having a desired spatial power distribution and temporal shape. The shaper 206 may combine two or more separate pulses to form one combined pulse having a composite shape. The shaper 206 thus produces an energy field having a shape that matches a treatment area of the substrate and a uniform distribution of power to process the treatment area uniformly.

The shaped energy 218 processes a substrate positioned on the work surface 208. The work surface 208 is typically movable, as indicated by arrow 210, to allow positioning various treatment areas of the substrate opposite the energy emerging from the shaper 206.

The apparatus 200 may include an optional acoustic sensor 220 positioned proximate the work surface 208 to receive acoustic signals from a substrate being processed on the work surface 208. Recrystallization changes the specific volume of a material very quickly, and can generate a characteristic acoustic signal depending on the type of solid formed. This acoustic signal can be detected and sent to the controller 212 to confirm formation of a large crystal solid. Other sensors, such as reflectometers, pyrometers, and radiometers may be used alone or with other sensors to observe phase changes in the substrate, and to observe the propagation of phase changes through the substrate.

An embodiment of the apparatus 200 that may be used to perform methods described herein is described in commonly assigned United States Patent Publication 2009/0032511.

While the foregoing is directed to embodiments of the invention, other and further embodiments of the invention may be devised without departing from the basic scope thereof.

What is claimed is:
1. A method of treating a substrate, comprising:
  delivering a first laser pulse having energy of 0.45 J/cm$^2$ and duration of 26 nsec to the substrate from a first laser;
  delivering a second laser pulse having energy of 0.45 J/cm$^2$ and duration of 26 nsec to the substrate from a second laser;

after a first freeze period of 700 nsec, delivering a third laser pulse having energy of 0.45 J/cm² and duration of 26 nsec to the substrate from a third laser; and after a second freeze period of 1,200 nsec, delivering a fourth laser pulse having energy of 0.26 J/cm² and duration of 26 nsec to the substrate from a fourth laser.

2. The method of claim 1, further comprising maintaining an ambient temperature of the substrate below 100° C.

3. The method of claim 1, further comprising repeating the delivery the first, second, third, and fourth laser pulses to the substrate.

* * * * *